US011271587B2

(12) United States Patent
Tseng

(10) Patent No.: US 11,271,587 B2
(45) Date of Patent: Mar. 8, 2022

(54) COMPRESSED SENSING APPARATUS, SYSTEM AND METHOD FOR PROCESSING SIGNALS IN SET FUNCTION

(71) Applicant: National Central University, Taoyuan (TW)

(72) Inventor: Kuo-Shih Tseng, Taoyuan (TW)

(73) Assignee: National Central University, Taoyuan (TW)

( * ) Notice: Subject to any disclaimer, the term of this patent is extended or adjusted under 35 U.S.C. 154(b) by 0 days.

(21) Appl. No.: 16/993,338

(22) Filed: Aug. 14, 2020

(65) Prior Publication Data
US 2021/0336633 A1  Oct. 28, 2021

(30) Foreign Application Priority Data

Apr. 28, 2020  (TW) .................................. 109114206

(51) Int. Cl.
*H03M 7/00*  (2006.01)
*G01D 21/00*  (2006.01)
*H03M 7/30*  (2006.01)

(52) U.S. Cl.
CPC .......... *H03M 7/3062* (2013.01); *G01D 21/00* (2013.01)

(58) Field of Classification Search
CPC ............................ H03M 7/3062; G01D 21/00
See application file for complete search history.

(56) References Cited

U.S. PATENT DOCUMENTS

| 7,289,049 B1* | 10/2007 | Fudge ................. H03M 1/1245 341/123 |
| 2009/0307697 A1* | 12/2009 | Hurley ................ G06F 11/3466 718/102 |
| 2011/0101977 A1* | 5/2011 | Nakanishi .......... G01R 33/3692 324/307 |
| 2012/0259590 A1* | 10/2012 | Ye ...................... G06K 9/00523 702/189 |
| 2015/0178944 A1* | 6/2015 | Haimi-Cohen ..... H03M 7/3062 382/107 |

OTHER PUBLICATIONS

R. Gribonval, Atoms of all channels, unite! Average case analysis of multi-channel sparse recovery using greedy algorithms, Dec. 2008, Journal of Fourier Analysis and Applications, pp. 1-33 (Year: 2008).*

* cited by examiner

*Primary Examiner* — Mischita L Henson
(74) *Attorney, Agent, or Firm* — Demian K. Jackson; Jackson IPG PLLC

(57) ABSTRACT

The present invention relates to a compressed sensing apparatus for compressed sensing of a set function consisting of a plurality of input sets containing a group of data. The apparatus includes: a plurality of sensing units acquiring a group of sampling data representing a plurality of sampling sets selected out of the plurality of input sets; a compression and computation unit enabling a compression to the group of data based on the group of sampling data in accordance with a Fourier basis set generated on the basis of the plurality of input sets and sampling sets, and a computation to compute a Fourier coefficient set based on a sparse regression technique which is in relation with the Fourier basis set; and a reconstruction unit predicting the group of data based on the Fourier coefficient set.

11 Claims, 10 Drawing Sheets

COMPRESSED SENSING APPARATUS, SYSTEM AND METHOD FOR PROCESSING SIGNALS IN SET FUNCTION

FIELD

The present invention relates to a compressed sensing apparatus, system and method for sets and set functions, in particular to a compressed sensing apparatus, system and method for compressed sensing of signals in a set function consisting of multiple input sets in the Fourier frequency domain for signal processing.

BACKGROUND

In the state of the art, the compressed sensing, which is also referred to as the compressive sensing, the compressive sampling, or the sparse sampling, is a signal processing technique that is capable of efficiently reconstructing and estimating a population consisting of original signals based on very few sampling signals concluded as a subset of a set function forming the population. In alternative, the compressed sensing is defined as a mathematical issue to find solutions to the underdetermined linear system. It magically exploits the sparsity of sampling signals to recover and predict original signals depending upon a few of sampling signals.

Due to its powerful potential to reduce to practice and strong utility applicable to various industries of, such as, information & communication, computation, electronics and electrical engineering, etc., the compressive sensing technique has been widely applied in various fields, such as, image processing, signal processing and computation, to manage a verity of issues such as, imaging, image compression, underdetermined linear system, group testing, heavy hitters, sparse coding, multiplexing, and sparse sampling, inverse problem, design of radiating systems, design of radar system, design of antenna, computational photography, etc.

However, although the compressed sensing seems quite efficient and feasible for most circumstances in various technical fields, it is yet to deal with a set function, values, data or signals in a set or concluded as a set function, and certainly fails to deal with practical engineering issues defined and described via a set function. For instance, when a compressed sensing technique is applied to a set function concludes lot of signals or data acquired from N input sets that are respectively corresponded to multiple sensors discretely distributed within a specific geographical or environmental area. Under such circumstance, the total number of possible output values n for a set function is as large as $n=2^N$.

In the above set-function case, it is apparent the number of input sets N is easy to be increased up to over 100 in reality world. For example, it is easily necessary to deploy 100 or more monitoring sensors over such a relatively large area for an oceanic monitoring application. In consequence, the total number of possible output values n or namely the size of the set function is rapidly expanded over 30 orders of magnitude (of $1\times10^{30}$) that is undoubtedly a huge amount of numbers at all, for which the current technologies of data storage and computation can hardly or impossibly manage, and the compressed sensing schemes in the prior art fail to deal with such cases as well.

Hence, there is a need to solve the above deficiencies/issues.

SUMMARY

In view of the state of the art, the present invention provides an efficient scheme that enables a compression of the original signals in a set, a set function, sets or set functions to the Fourier frequency domain by truncating insignificant Fourier bases less than or equal to a threshold value with lossless or little loss of quality with respect to original signals, and estimating Fourier coefficients of set function according to the sampling signals. Then a reconstruction, a predication, or an estimation to the original signals in a set function is simply carried out based on the Fourier coefficients, the Fourier bases, and the sampling signals.

The present invention provides a compressed sensing apparatus for compressed sensing of a set function consisting of a plurality of input sets containing a group of data, which includes: a plurality of sensing units acquiring a group of sampling data representing a plurality of sampling sets selected out of the plurality of input sets; a compression and computation unit enabling a compression to the group of data based on the group of sampling data in accordance with a Fourier basis set generated on the basis of the plurality of input sets and sampling sets, and a computation to compute a Fourier coefficient set based on a sparse regression technique which is in relation with the Fourier basis set; and a reconstruction unit predicting the group of data based on the Fourier coefficient set.

Preferably, the plurality of sensing units are sensors selected from an image sensor, a group consisting of a Piezoelectric crystal chemical sensor, a surface acoustic wave sensor, an optical chemical sensor, an electrochemical sensor, a semiconductor-based chemical sensor, a surface plasmon resonance chemical sensor, a biosensor, a thermochemical sensor, a magnetic chemical sensor, a field chemical sensors, a toxic gas field chemical sensor, a chemical sensor, a MEMS based sensor, a Nano-crystal chemical sensor, an electromagnetic wave sensor, a mechanical wave sensor, a heat sensor, a force sensor, and a combination thereof.

Preferably, the compressed sensing apparatus further includes: a processing unit determining a sensing matrix for the set function by learning a relationship between the group of sampling data and the group of data, wherein a number of the group of sampling data is less than a number of the group of data.

Preferably, the processing unit is further used for: generating the Fourier basis set containing a plurality of Fourier bases that is determined on the basis of a relationship of corresponding sets' intersection and more than a threshold value; determining a Fourier transform matrix based on the Fourier basis set; and computing a reconstruction matrix based on the sensing matrix and the Fourier transform matrix.

Preferably, the processing unit is further used for: reconstructing the plurality of input sets by estimating the group of data based on the reconstruction matrix, the Fourier coefficient set and the Fourier basis set.

Preferably, the Fourier coefficient set contains a plurality of Fourier coefficients for the set function.

The present invention further provides a compressed sensing system for compressed sensing and transmitting of a set function consisting of a plurality of input sets containing a group of data, which includes: at a transmitting end, a plurality of sensing units acquiring a group of sampling data representing a plurality of sampling sets selected out of the plurality of input sets; a compression and computation unit enabling a compression to the group of data based on the group of sampling data in accordance with a Fourier basis set generated on the basis of the plurality of input sets and sampling sets, and a computation to compute a Fourier coefficient set based on a sparse regression technique which is in relation with the Fourier basis set; and a RF transmitter sending the Fourier coefficient set through a wireless communication module; and at a receiving end, a RF receiver receiving the Fourier coefficient set sent from the transmitter; and a reconstruction unit estimating the group of data based on the Fourier coefficient set.

Preferably, the transmitting end and the receiving end are communicatively connected with each other through the wireless communication module.

Preferably, the wireless communication module is a Bluetooth communication module, a Wi-Fi communication module, a telecommunication module, an infrared communication module, or a radio frequency transmission module.

The present invention further provides a compressed sensing method for compressed sensing of a set function consisting of a plurality of input sets containing a group of signals, which includes: performing a sampling by a plurality of sensor units to acquire a group of sampling signals representing a plurality of sampling sets selected out of the plurality of input sets; enabling a compression to the group of signals with respect to the group of sampling signals by a compression unit in accordance with a Fourier basis set generated on the basis of the plurality of sampling sets and input sets; computing a Fourier coefficient set by a computation unit based on a sparse regression technique in relation with the group of sampling signals; and enabling a reconstruction to reconstruct the group of signals based on the Fourier coefficient set.

Preferably, the compressed sensing method further includes: determining a sensing matrix for the set function by a processing unit by learning a relationship between the group of sampling signals and the group of signals, wherein a number of the group of sampling signals is less than a number of the group of signals.

Preferably, the compressed sensing method further includes: generating the Fourier basis set containing a plurality of Fourier bases that is determined on the basis of a relationship of corresponding sets' intersection and more than a threshold value by the processing unit; determining a Fourier transform matrix based on the Fourier basis set by the processing unit; and computing a reconstruction matrix based on the sensing matrix and the Fourier transform matrix by the processing unit.

Preferably, the compressed sensing method further includes: reconstructing the plurality of input sets by estimating the group of signals based on the reconstruction matrix, the Fourier coefficient set and the Fourier basis set by a reconstruction unit.

Preferably, the compressed sensing method further includes by a processing unit to perform: generating the Fourier basis set containing a plurality of Fourier bases available from performing a computation to all of the plurality of intersected Fourier bases F'(i, j) consisting of intersected $i^{th}$ order and $j^{th}$ Fourier bases for i=0~N, j=1~$C_j^N$, where F'(i, j) denotes an intersected set function of input sets for respective different Fourier bases, i denotes respective $i^{th}$ order bases from 0 to a number of the plurality of input sets N, and j denotes respective $j^{th}$ bases in a particular $i^{th}$ order basis from 1 to totally $C_j^N$; determining whether each of the plurality of intersected Fourier bases F'(i, j) is more than a threshold value β; saving F'(i, j) as a Fourier basis $f_B$ and pushing it to a temporary repository of Fourier basis $f_{B\_1}$ if F'(i, j) is more than the threshold value β; skipping this basis if F'(i, j) is not more than the threshold value β; and ceasing the computation when the temporary repository of Fourier basis $f_{B\_1}$ is empty.

Preferably, when the threshold value β is set as zero, the generated Fourier basis set includes all Fourier bases required to exactly recover the set function.

Preferably, when the threshold value β is larger than zero, a part of all Fourier bases required to exactly recover the set function is discard to approximate the set function.

Preferably, the Fourier coefficient set contains a plurality of Fourier coefficients for the set function.

DESCRIPTION OF THE DRAWINGS

A more complete appreciation of the invention and many of the attendant advantages thereof are readily obtained as the same become better understood by reference to the following detailed description when considered in connection with the accompanying drawing, wherein.

DETAILED DESCRIPTION

Figure 1A:
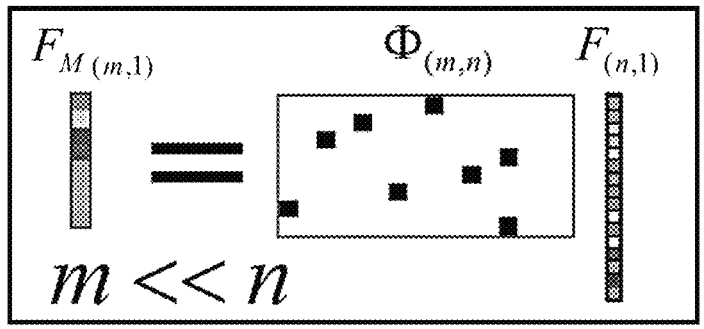
FIG. 1(a) is a schematic diagram illustrating a signal acquisition and sampling phase in accordance with the present invention.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

It is to be noticed that the term "including", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device including means A and B" should not be limited to devices consisting only of components A and B.

The disclosure will now be described by a detailed description of several embodiments. It is clear that other embodiments can be configured according to the knowledge of persons skilled in the art without departing from the true technical teaching of the present disclosure, the claimed disclosure being limited only by the terms of the appended claims.

When a compressed sensing technique is applied to compress a set function concluding lot of digital signals or data acquired from, such as but not limited to, the numbers of sensors deployed within a geographical sensing area or used for the same specific mission, or the numbers of image sources, audio or video sources, it defines the set function is a function that includes N input sets, sets, or subsets. In consequence, the total number of possible output values n, preferably in a format of binary or floating point, for a set function is $n=2^N$.

Therefore, for example, when the number of input sets N is increased up to the number of 100, which is just a small amount of the number for most environmental monitoring or sensing missions carried out at open field and easily exceeded in number, the total number of possible output values n or namely the size of the set function is rapidly expanded over the number of $1\times10^{30}$ that is a huge amount of numbers, for which the current technologies of data storage and computation can hardly manage. Hence, when the compressed sensing technique is reduced to practice to deal with various realities of applications that is based on the set function, it is critical to develop an improvement to deal with the set-function based issues and related realties of applications, to estimate or approximate data in a function, e.g.: environmental coverage or data compression or communication, as rapidly and precisely as possible.

Figure 1B:
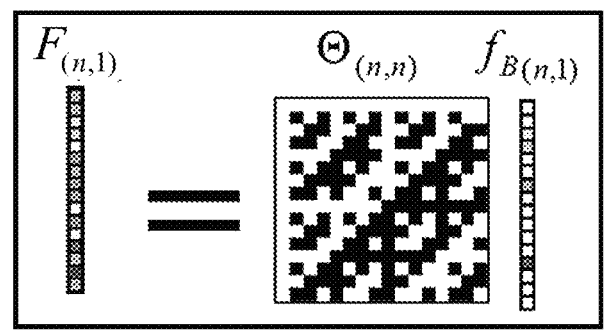
FIG. 1(b) is a schematic diagram illustrating a signal transformation and compression phase in accordance with the present invention.
Figure 1C:
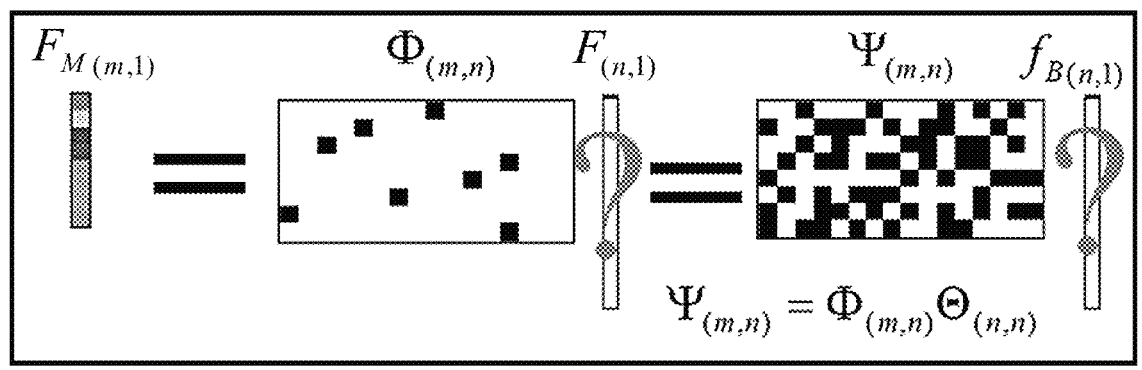
FIG. 1(c) is a schematic diagram illustrating a signal reconstruction phase in accordance with the present invention.

FIG. 1(a) is a schematic diagram illustrating a signal acquisition and sampling phase in accordance with the present invention; FIG. 1(b) is a schematic diagram illustrating a signal transformation and compression phase in accordance with the present invention; and FIG. 1(c) is a schematic diagram illustrating a signal reconstruction phase in accordance with the present invention. In order to reconstruct or transmit all the output values concluded in the set function as accurate and complete as possible with least data size and computation-demanding, preferably a compressed sensing technique with the discrete Fourier transform, the fast Fourier transform, or the Hadamard transform, or the Walsh-Hadamard transform, involved in is applied for example. First of all, it is to learn the set function in the Fourier frequency domain and then recovery it in the spatial domain.

It is assumed there are N input sets. As shown in FIG. 1(a), the submodular set function is $F_{(n,1)}$, where $n=2^N$. The system first acquires signals from the submodular set function $F_{(n,1)}$ via a sensing matrix $\Phi_{(m,n)}$ and collect a measurement vector matrix $F_{M(m,1)}$ for learning, where $m \ll n$. The system has to recover the signal F by using the signal transformations as shown in FIG. 1(b).

It is noticed that this is an ill-conditioned linear inverse problem. However, if the signals distributed in certain domains are sparse, the system is able to recover original signal matrix F in set function using sparse regression. As show in FIG. 1(c), original signal matrix F is the inner product of the transform matrix $\Theta_{(n,n)}$ and the estimated Fourier coefficient $f_{B(n,1)}$. The $f_{B(n,1)}$ has only k nonzero values, so called k-support. Since the transformation matrix $\Theta_{(n,n)}$ and the sensing matrix $\Phi_{(m,n)}$ are already known, the reconstruction matrix $\Psi_{(m,n)}$ can be thus computed accordingly. Although it is impossible to directly recover original signal matrix F, the system can recover the estimated Fourier coefficient $f_{B(n,1)}$, if k<m, and then reconstruct F. The signal recovery formulation is given as $$\hat{f}_B = \text{argmin } \frac{1}{2}\|F_M - \Psi f_B\|^2 + \lambda |f_B|_1,$$

where $f_{B(n,1)}$ is the estimated coefficients for the set function in the Fourier frequency domain, $F_{M(m,1)}$ is a measurement vector matrix of the set function, $\Psi_{(m,n)}$ is a reconstruction matrix (a.k.a. a dictionary matrix), $\Phi_{(m,n)}$ is a sensing matrix, and $\Theta_{(n,n)}$ is a Fourier transform matrix.

Although the aforementioned technique is able to apply to applications regarding compressing signals sourced from images or videos. However, it is inapplicable for compressing signals from a set function, since the total number of possible output values are easily exceeded over $n=2^N$. For example, in a set function based application where N=30 or larger, a Fourier transform matrix $\Theta_{(n,n)}$ in two dimension becomes to have dimensions as large as of $1\times10^{30}$ by $1\times10^{30}$, which is infeasible for storage and computation, as previously described. Hence in the present invention, it further provides a novel technique to compute the required Fourier basis so as to overcome this issues.

Typically, a collection of the Fourier basis consists of multiple bases from different orders, and is a collection of $0^{th}$ order basis (while picking up with no output set as sampling set), $1^{st}$ order basis (while picking up one output set as sampling set), $2^{nd}$ order basis (while picking up two output sets as sampling sets), $3^{rd}$ order basis (while picking up three output sets as sampling sets) . . . to $N^{th}$ order basis (while selecting all of N output sets as sampling sets). Therefore, a parameter of threshold value $\beta \in R$, which is a real number with arbitrary values, is duly introduced in accordance with the present invention. For the condition when a threshold value $\beta$ is set as zero, it means that the generated Fourier basis is a collection of all necessary bases (all the Fourier coefficients that have non-zero values), and the set function can be exactly recovered at the condition. For the condition when $\beta>0$, it means a part of insignificant Fourier basis is partially discard or truncated, the set function is approximately recovered. In other words, the $\beta$ parameter is the trade-off between the reconstruction accuracy and computational efficiency.

Accordingly, the present invention provides a Fourier basis generator scheme to generate required Fourier bases for a condition of a reasonable and balanced trade-off, which the basis generator can generate least or almost least required Fourier basis used for compressed sensing. In the beginning, the system generates the Fourier basis set containing a plurality of Fourier bases available from performing a computation to all of the plurality of intersected Fourier bases F'(i, j) consisting of intersected $i^{th}$ order and $j^{th}$ Fourier bases for i=0~N, j=1~$C_j^N$, where F'(i, j) denotes an intersected set function of input sets for respective different Fourier bases, i denotes respective $i^{th}$ order bases from 0 to a number of the plurality of input sets N, and j denotes respective $j^{th}$ bases in a particular $i^{th}$ order basis from 1 to totally $C_j^N$. Then the system determines whether each of the plurality of intersected Fourier bases F'(i, j) is more than a threshold value ft. If F'(i, j) is more than the threshold value β, F'(i, j) is saved as a Fourier basis $f_B$ and pushed to a temporary repository of Fourier basis $f_{B\_1}$. If F'(i, j) is not more than the threshold value β this basis is skipped. When the temporary repository of Fourier basis $f_{B\_1}$ is empty or null, the above computation is terminated.

Figure 2:
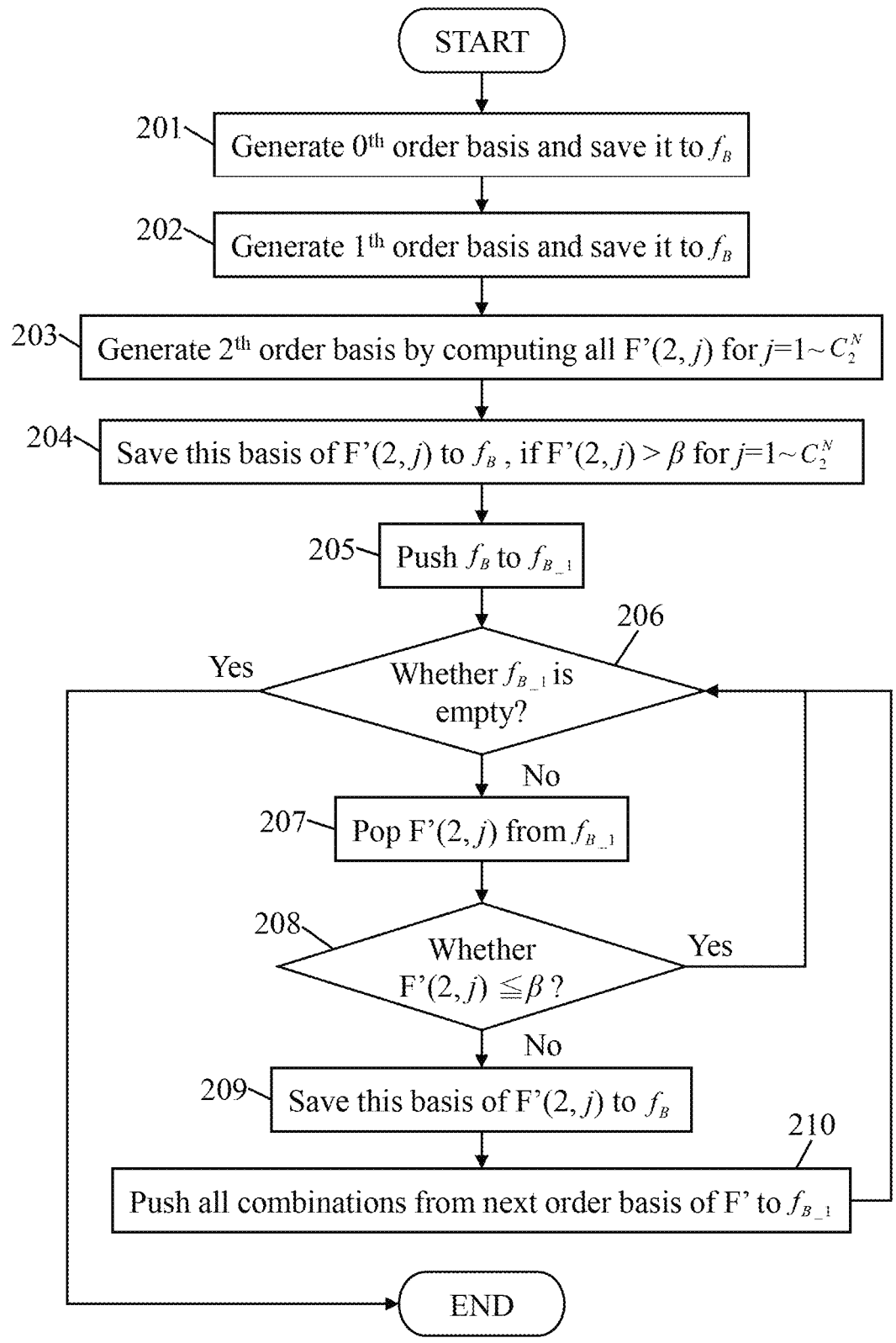
FIG. 2 is a flow chart of computation illustrating a Fourier basis generator scheme for generating required Fourier bases for computing the second order bases in accordance with the present invention.

FIG. 2 is a flow chart of computation illustrating a Fourier basis generator scheme for generating required Fourier bases for computing the second order bases in accordance with the present invention. The computational work flow of basis generator is as shown in FIG. 2. The process 200 begins with as follows. Prior to computing a second order bases, the system generates and saves $0^{th}$ order Fourier bases and saves it to $f_B$, at 201, and generates and saves $1^{th}$ order Fourier bases and saves it to $f_B$, at 202 respectively. Then, the system generates $2^{nd}$ order bases by computing all F'(2, j) for j=1~$C_2^N$, at 203, and saves this basis of F'(2, j) to $f_B$ if F'(2, j)>β for j=1~$C_2^N$, at 204, and push $f_B$ to $f_{B\_1}$, at 205. Otherwise, the system skips this basis. F'(2, j) denotes an intersected set function of two input sets and j denotes the $j^{th}$ basis under $2^{nd}$ order bases from $C_2^N$ bases. If F'(2, j)>β, this basis will be further extended to higher order sets, e.g.: parts of F'(3, j). Then system determines whether $f_{B\_1}$ is empty, at 206. Once $f_{B\_1}$ is empty, the Fourier basis is completely generated, and the computation is ended. If the $f_{B\_1}$ is not empty, then pop F' from $f_{B\_1}$, at 207. Furthermore, system determines whether F'≤β, at 208 if F'≤β the system return to the step computing whether $f_{B\_1}$ is empty, at 206. If F'>β, the system saves this basis of F' to $f_B$, at 209, and then pushes all combinations from next order basis of F' to $f_{B\_1}$, at 210. Once $f_{B\_1}$ is empty, the $f_B$ is the Fourier basis of this compressed sensing system.

Figure 3:
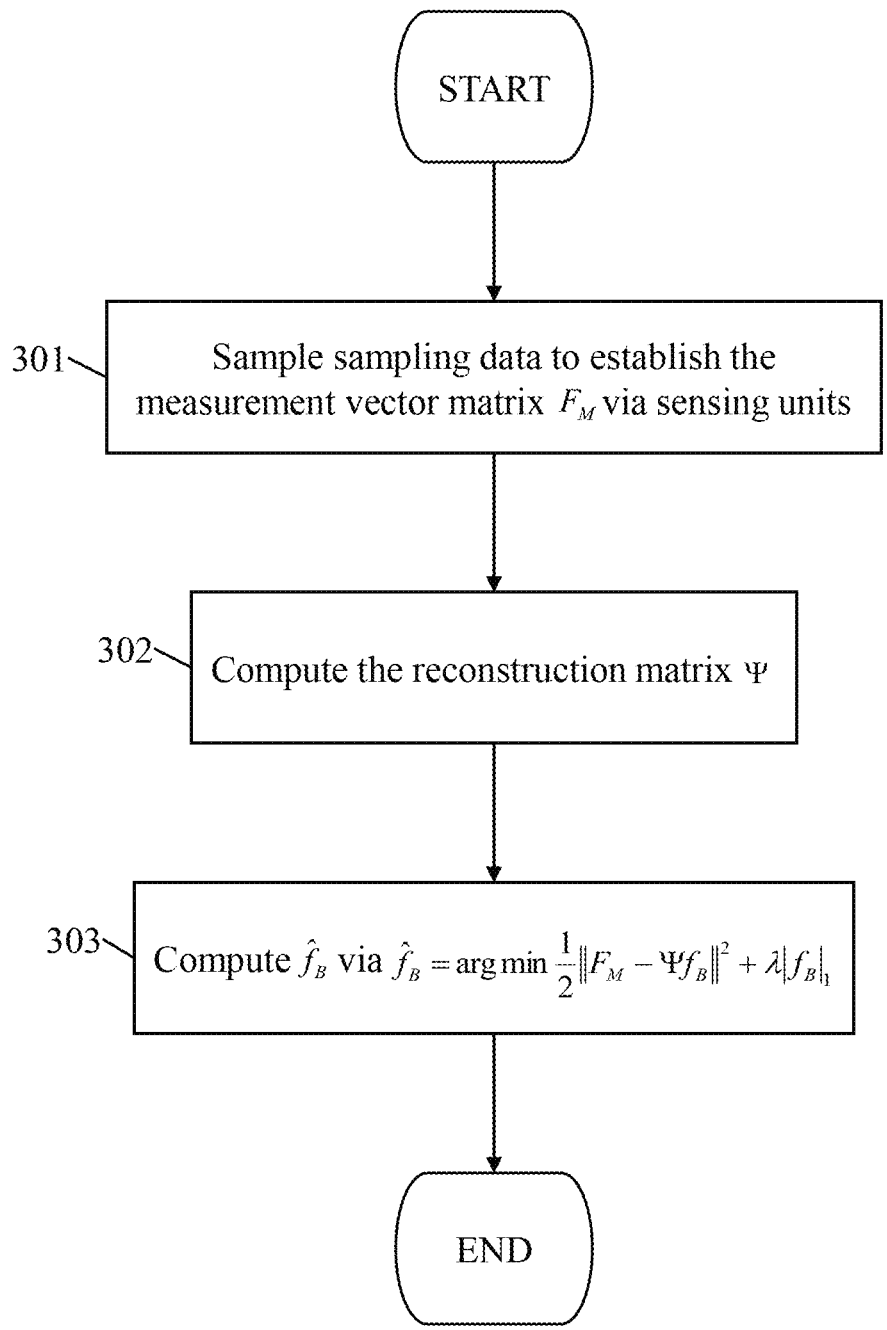
FIG. 3 is a flow chart illustrating a compressed sensing technique using the Fourier bases generated in accordance with the present invention.

FIG. 3 is a flow chart illustrating a compressed sensing technique using the Fourier bases generated in accordance with the present invention. As shown in FIG. 3, The process 300 commences at the sampling, and the system samples sampling data to establish the measurement vector matrix $F_M$ via sensing units, at 301. Based on the sampling data namely the measurement vector matrix $F_M$, then the system computes the reconstruction matrix Ψ, at 302. Then, the system computes the estimated coefficients $\hat{f}_B$ of the set function in the via $$\hat{f}_B = \operatorname{argmin} \frac{1}{2}\|F_M - \Psi f_B\|^2 + \lambda|f_B|_1,$$

Figure 4:
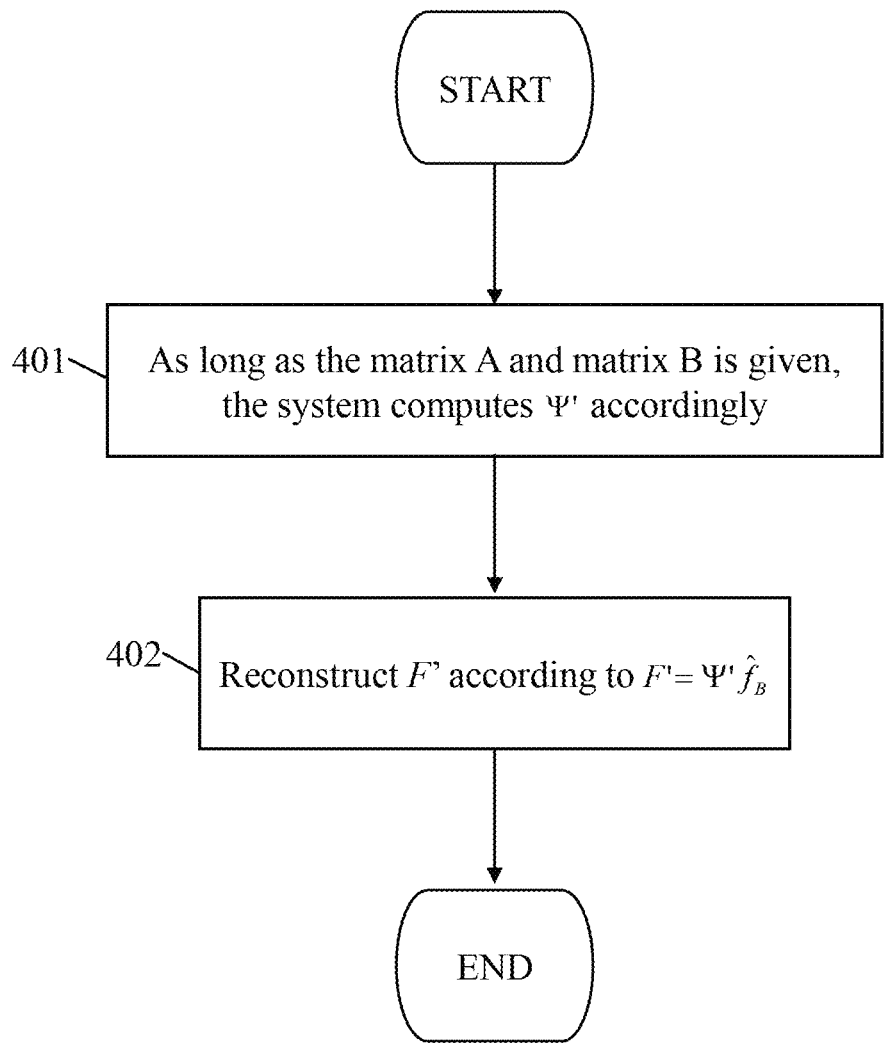
FIG. 4 is a flow chart illustrating a reconstruction technique in accordance with the present invention.

FIG. 4 is a flow chart illustrating a reconstruction technique in accordance with the present invention. As shown in FIG. 4, The process 400 begins as follows. Once the $\hat{f}_B$ is computed and obtained, the system is able to recover any values of the set function via the mathematical relation of F'=Ψ'$\hat{f}_B$, where the matrix F' is the desired set function values, Ψ' is computed via matrixes A and B, the matrix A is the desired set, and the matrix B is the basis set of $\hat{f}_B$. As long as the matrix A and matrix B is given, the system computes Ψ' accordingly, at 401. When Ψ' is available, the matrix F' computed according to the mathematical relation of F'=Ψ'$\hat{f}_B$. The system reconstructs F' according to F'=Ψ'$\hat{f}_B$, at 402.

Figure 5:
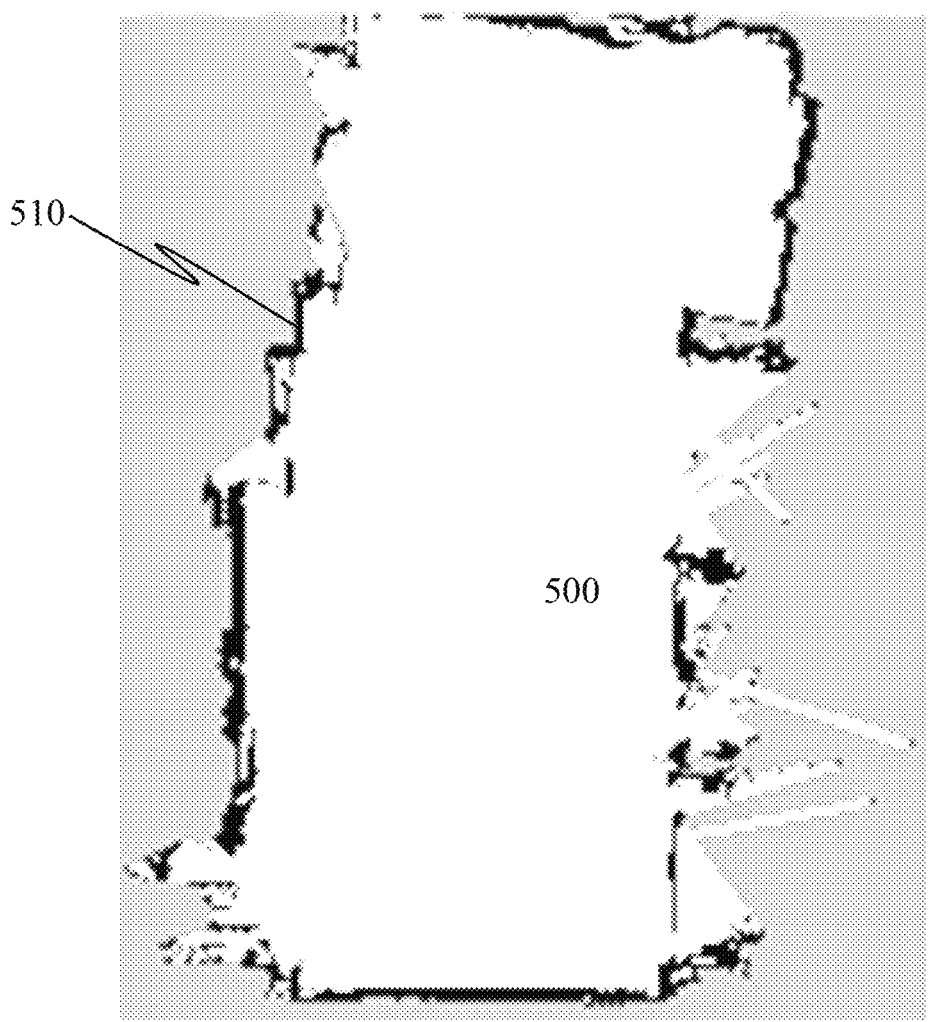
FIG. 5 is a schematic diagram illustrating a specific sensing area in a grid map defined with a boundary line for the practical environmental sensing embodiment in accordance with the present invention.
Figure 6:
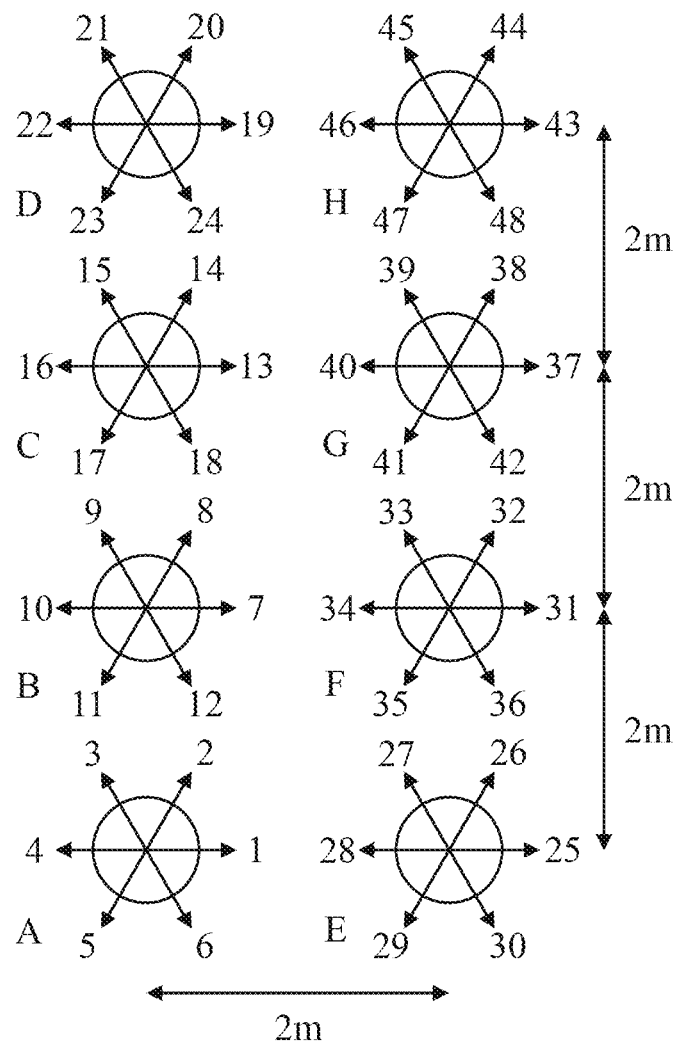
FIG. 6 is a schematic diagram illustrating a preferable layout for forming 48 input sets corresponding to 48 sensing units within the specific sensing area in the practical embodiment in accordance with the present invention.
Figure 7:
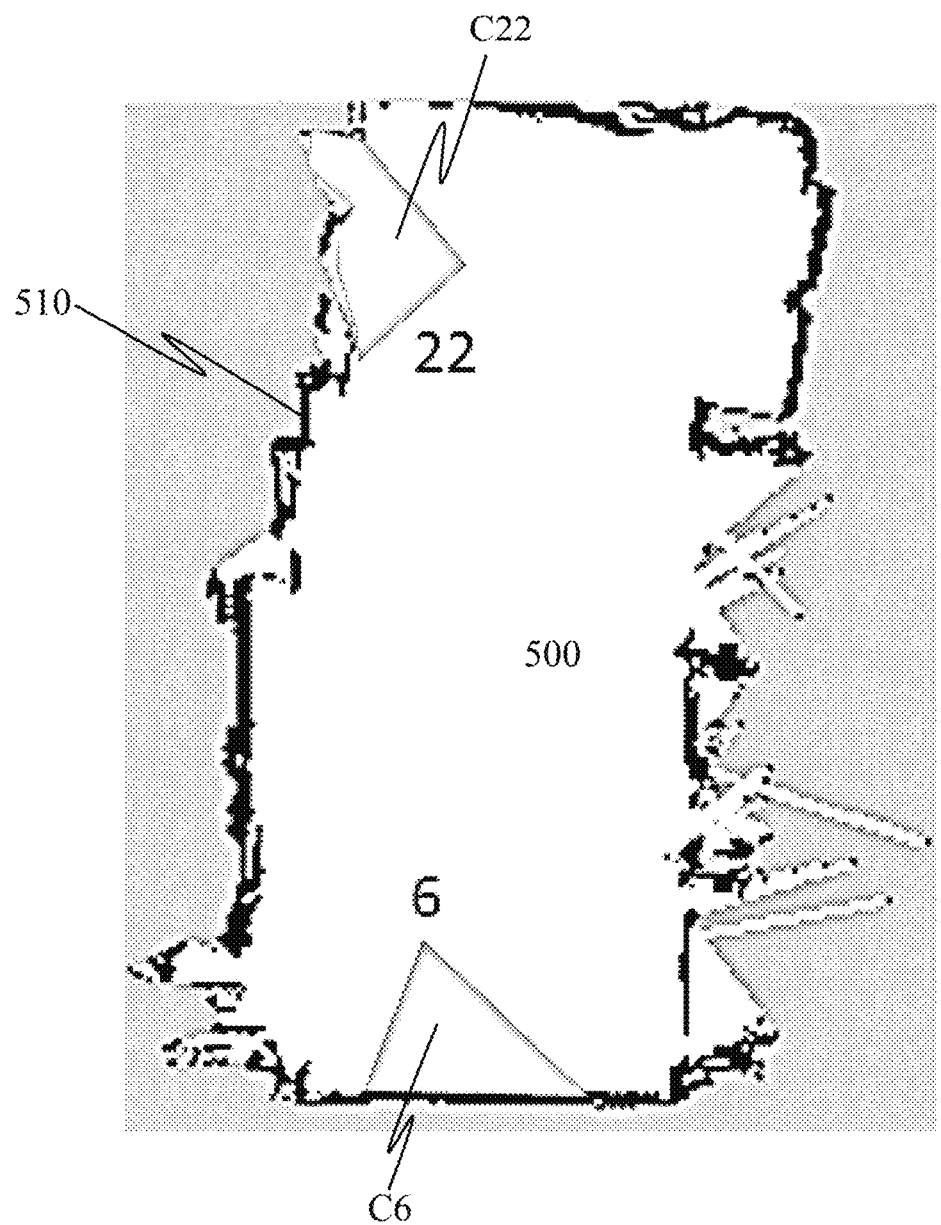
FIG. 7 is a schematic diagram illustrating sensing covered areas for particular 2 input sets corresponding to particular 2 sensing units for the practical environmental sensing embodiment in accordance with the present invention.

FIG. 5 is a schematic diagram illustrating a specific sensing area in a grid map defined with a boundary line for the practical environmental sensing embodiment in accordance with the present invention; FIG. 6 is a schematic diagram illustrating a preferable layout for forming 48 input sets corresponding to 48 sensing units within the specific sensing area in the practical embodiment in accordance with the present invention; FIG. 7 is a schematic diagram illustrating sensing covered areas for particular 2 input sets corresponding to particular 2 sensing units for the practical environmental sensing embodiment in accordance with the present invention.

As shown in FIG. 5, which depicts an environmental geographical map M with a drawn boundary BM and in grid as a sensing area to be sensed and detected. As shown in FIG. 6, it shows a preferable layout including multiple 8 spots A-H to form 48 input sets. The preferable layout includes 8 spots which are equally spaced by a distance of 2 meters in horizontal and vertical direction to form a formation of array of 4 by 2. For example, the 48 input sets are preferably formed by 48 sensors correspondingly. Each of 48 sensors are preferably, such as but not limited to, motion sensors or image sensors, and could have the heading angel of 0, 60, 120, 180, 240, 270 degrees to detect and sense any action or to obtain images surrounding the spot.

When the system selects motion sensors, such as but not limited to, an Xbox Kinect sensor, as sensors to detect and sense, 2 motion sensors are correspondingly put into the right spots corresponding to the selected input set to sense motions occurring within the specific sensing area. The sensing range and field of view (FOV) of each sensor are 4 meters and 60 degrees, respectively. As shown in FIG. 7, if the selected input sets are 6 and 22 that are corresponded to $6^{th}$ sensor and $22^{th}$ sensor, the respective coverages for $6^{th}$ sensor and $22^{th}$ sensor is labeled as C6 and C22. The entire coverage of $6^{th}$ and $22^{th}$ sensors is F(6∪22), where F is coverage function which is one kind of the set function. The propose is to reconstruct the set function for coverage applications. However, the total number of all coverage values is 281,474,976,710,656. It's infeasible to get all coverage values via sensing all possible values in this map.

The present invention provides an initial step is to generate a series of Fourier bases, as aforementioned and illustrated in FIG. 2. It is noticed the F' is the intersected set function of input sets. For example, F'(6,22)=F(6∩22). As shown in FIG. 7, there is no intersection between set 6 and 22. Hence, F(6∩22)=0. This Fourier basis will not be saved as one Fourier basis of $f_B$. After running the Fourier basis generator algorithms, as aforementioned and illustrated in FIG. 3, in the map, as aforementioned and illustrating in FIG. 5, there are totally 6,568 Fourier bases generated.

The first step is to sample m data, where m>=6568, and compute Ψ. the estimated coefficients of the coverage function in the Fourier frequency domain ($\hat{f}_B$) is compute via $$\hat{f}_B = \operatorname{argmin} \frac{1}{2}\|F_M - \Psi f_B\|^2 + \lambda|f_B|_1$$

or $\hat{f}_B = \Psi^{-1} F_M$ (as a pseudo inverse). The second step is to recover the coverage function via $\hat{f}_B$. When any input sets (A) is given, Ψ' is computed via matrixes A and B. The reconstructed coverage values are computed according to the mathematical relationship of F'=Ψ'$\hat{f}_B$.

In this embodiment, the 281,474,976,710,656 values of coverage function can be exactly recovered via 6568 values in the Fourier frequency domain. In other words, the compression ratio is 42,855,508,025. This embodiment demonstrates the high compression ratio of this invention for coverage applications.

Figure 8:
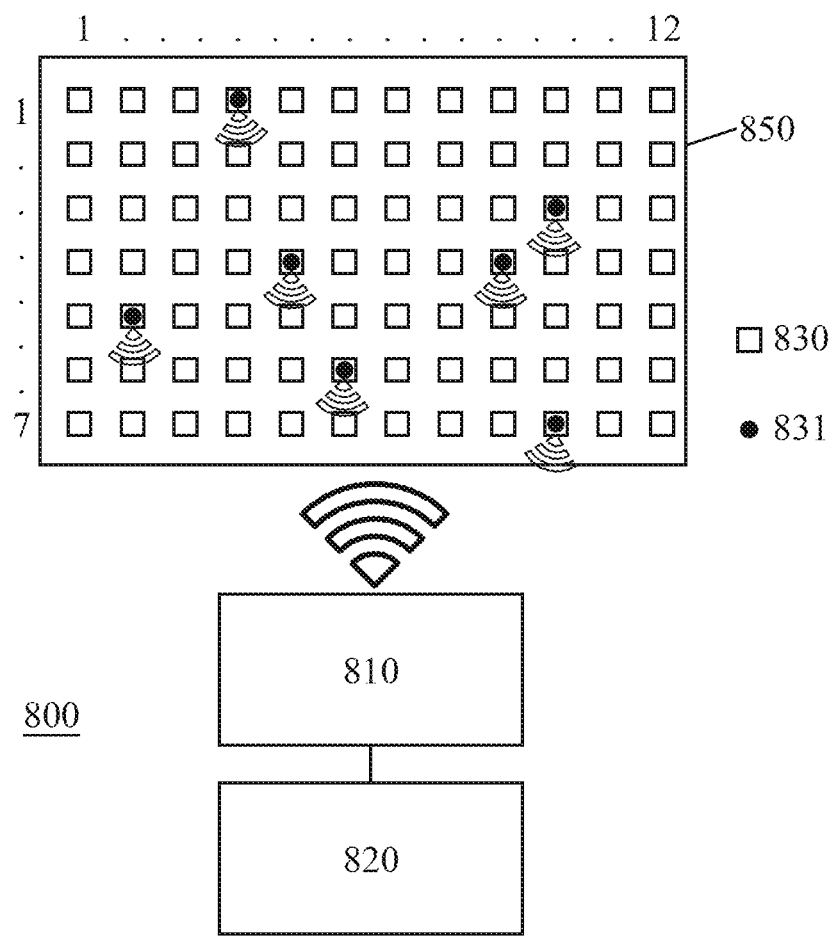
FIG. 8 is a schematic diagram illustrating a compressed sensing apparatus in accordance with the present invention.

FIG. 8 is a schematic diagram illustrating a compressed sensing apparatus in accordance with the present invention. The present compressed sensing apparatus includes a series of sensing stations 831 with a total number of N, such as but not limited to N=12×7=84 in this embodiment, separately distributed within a specific sensing area 850 in a formation of regular square or rectangular array or irregular random distribution, each of which the sensing stations 831 represents a particular one of input sets with a total number of N and containing lot of original signals. There are a series of sensing units 830 with a total number of k, such as but not limited to k=6 in this embodiment, placed on a part of sensing stations 831, to acquire multiple sampling values, data or signals with a total number of m. When the sensing stations 831 with a total number of N within the specific sensing area 850 and the original signals included therein are regarded as a set function, the total number of possible output values n in this set function is as large as $n=2^N$, for which even the currently most advanced and powerful computerized tools can hardly manage.

However, the compression and computation unit 810 included in the present compressed sensing apparatus 800, receives the sampling signals with a total number of m detected and sampled by, and transmitted from the sensing units 830 with total number of k via a wireless transmission to form sampling sets. Then a Fourier basis set is generated on the basis of the input sets and sampling sets, so as to compute a Fourier coefficient set based on a sparse regression technique which is in relation with the Fourier basis set, to enable a compression to the original signals based on the sampling signals, wherein the generated Fourier basis set contains multiple Fourier bases that is determined on the basis of a relationship of corresponding sets' intersection and more than a threshold value. Then a Fourier transform matrix is determined based on the Fourier basis set and a reconstruction matrix is computed based on a sensing matrix and the Fourier transform matrix, wherein the sensing matrix for the set function is available and pre-learned from a relationship between the sampling signals and the original signals.

In subsequence, the reconstruction unit 820 receives the sampling signals, the reconstruction matrix, the Fourier coefficient set and the Fourier basis set and reconstructs, predicts or estimates the original signals accordingly. As long as a number of the sampling signals is less than a number of the original signals, or m<<n, the present compressed sensing apparatus 800 is capable of precisely reconstructing or well predicting or estimating the original signals in the input sets of a number of N in the set function.

Figure 9:
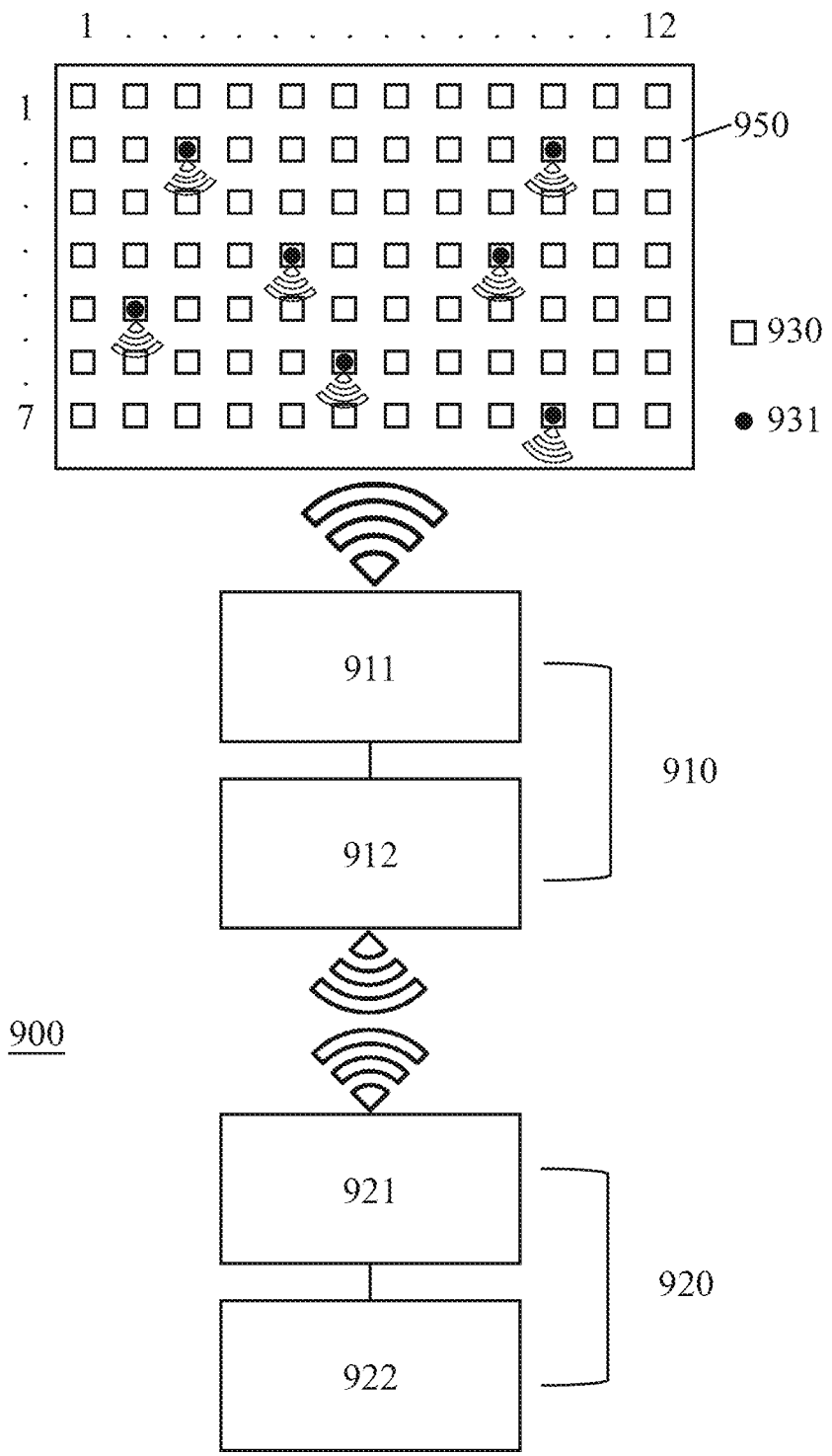
FIG. 9 is a schematic diagram illustrating a compressed sensing system in accordance with the present invention.

FIG. 9 is a schematic diagram illustrating a compressed sensing system in accordance with the present invention. Based on the compressed sensing apparatus 800 as aforementioned, the present compressed sensing system 900 includes a series of sensing stations 931 with a total number of N separately distributed within a specific sensing area 950, each of which the sensing stations 931 represents a particular one of input sets with a total number of N and containing lot of original signals. There are a series of sensing units 930 with a total number of k, deployed on a part of sensing stations 931 to acquire multiple sampling values, data or signals with a total number of m. The sensing stations 831 with a total number of N within the specific sensing area 950 and the original signals included therein form a set function.

The present compressed sensing system 900 further includes a transmitting end 910 and a receiving end 920, which the both ends are communicatively connected with each other via a wireless communication. Via a wireless transmission scheme, the compression and computation unit 911 included in the transmitting end 910 receives the sampling signals with a total number of m detected and sampled by, and transmitted from the sensing units 930 with total number of k to form sampling sets and generate a series of estimations for Fourier coefficients based on a sparse regression relation, to enable a compression to the original signals based on the sampling signals. Then the radio frequency (RF) transmitter 912 sends the estimations for Fourier coefficients, the other related parameters and the required signals to the RF receiver 921 at the receiving end 920.

The RF receiver 921 at the receiving end 920 is responsible for receiving Fourier coefficients, the other related parameters and the required signals. In consequence, the reconstruction unit 922 receives Fourier coefficients, the other related parameters and the required signals as well and reconstructs, predicts or estimates the original signals accordingly. As long as a number of the sampling signals is less than a number of the original signals, or m<<n, at the receiving end 920, the present compressed sensing system 900 is capable of precisely reconstructing or well predicting or estimating the original signals in the input sets of a number of N in the set function.

Figure 10:
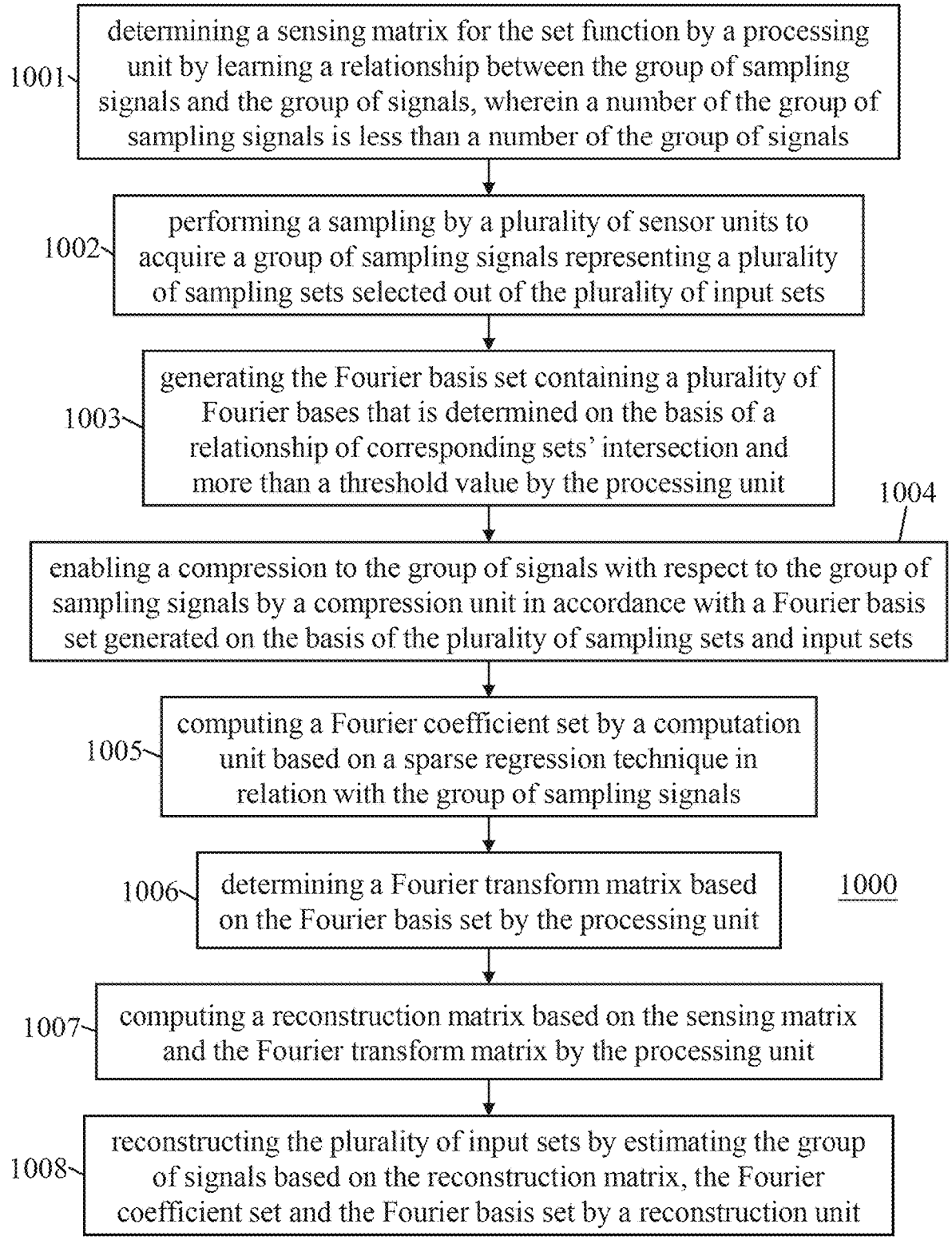
FIG. 10 is a flow chart showing multiple steps of implementing the compressed sensing method in accordance with the present invention.

FIG. 10 is a flow chart showing multiple steps of implementing the compressed sensing method in accordance with the present invention. In summary, the compressed sensing method in accordance with the present invention is capable of compressing sensing a plurality of signals included in a plurality of input sets in a set function and preferably includes following steps: determining a sensing matrix for the set function by a processing unit by learning a relationship between the group of sampling signals and the group of signals, wherein a number of the group of sampling signals is less than a number of the group of signals, at 1001; performing a sampling by a plurality of sensor units to acquire a group of sampling signals representing a plurality of sampling sets selected out of the plurality of input sets, at 1002; and generating the Fourier basis set containing a plurality of Fourier bases that is determined on the basis of a relationship of corresponding sets' intersection and more than a threshold value by the processing unit, at 1003.

Further to the above, the present compressed sensing method further includes following steps: enabling a compression to the group of signals with respect to the group of sampling signals by a compression unit in accordance with a Fourier basis set generated on the basis of the plurality of sampling sets and input sets, at 1004; computing a Fourier coefficient set by a computation unit based on a sparse regression technique in relation with the group of sampling signals, at 1005; determining a Fourier transform matrix based on the Fourier basis set by the processing unit, at 1006; computing a reconstruction matrix based on the sensing matrix and the Fourier transform matrix by the processing unit, at 1007; and reconstructing the plurality of input sets by estimating the group of signals based on the reconstruction matrix, the Fourier coefficient set and the Fourier basis set by a reconstruction unit, at 1008.

In conclusion, the present invention provides a novel Fourier basis generator scheme that is capable of generating a sparse collection of bases for a set function that is relatively sparsely distributed in the Fourier frequency domain by removing massive irrelevant bases. Thereafter, it is only required to collect and sample a few of signals associated with original signals in the time domain, which is sufficient for learning to establish a series relevant estimated parameters in the Fourier frequency domain providing for the reconstruction of the original signals in the time domain. The features to generate the sparse collection of bases in accordance with the present invention is as follows: generating all bases from $0^{th}$ order to $N^{th}$ order and determining whether if a certain basis of all bases is less than a threshold value, the system removes this certain basis out of all bases, such that massive irrelevant bases are truncated and discarded and the sparse collection of bases is generated.

The present invention is applicable to following applications, such as but not limited to: (1) the environmental monitor: the purpose is to put K sensors from N ground sets to monitor the temperature of an environment. The user needs to query the set functions to finding the desired solutions. This invention is able to provide the set functions; (2) the spatial search: the purpose is to arrive K sub-goals from N ground sets to search for targets in an environment. The user needs to query the set functions to finding the desired solutions This invention is able to provide the set functions; and (3) the 3D map exploration and reconstruction: The purpose is to arrive K sub-goals from N ground sets to build the map in an environment. The user needs to query the set functions to finding the desired solutions This invention is able to provide the set functions.

There are further embodiments provided as follows.

Embodiment 1: A compressed sensing apparatus for compressed sensing of a set function consisting of a plurality of input sets containing a group of data, including: a plurality of sensing units acquiring a group of sampling data representing a plurality of sampling sets selected out of the plurality of input sets; a compression and computation unit enabling a compression to the group of data based on the group of sampling data in accordance with a Fourier basis set generated on the basis of the plurality of input sets and sampling sets, and a computation to compute a Fourier coefficient set based on a sparse regression technique which is in relation with the Fourier basis set; and a reconstruction unit predicting the group of data based on the Fourier coefficient set.

Embodiment 2: The compressed sensing apparatus as described in Embodiment 1, wherein the plurality of sensing units are sensors selected from an image sensor, a group consisting of a Piezoelectric crystal chemical sensor, a surface acoustic wave sensor, an optical chemical sensor, an electrochemical sensor, a semiconductor-based chemical sensor, a surface plasmon resonance chemical sensor, a biosensor, a thermochemical sensor, a magnetic chemical sensor, a field chemical sensors, a toxic gas field chemical sensor, a chemical sensor, a MEMS based sensor, a Nanocrystal chemical sensor, an electromagnetic wave sensor, a mechanical wave sensor, a heat sensor, a force sensor, and a combination thereof.

Embodiment 3: A compressed sensing apparatus as described in Embodiment 1, further including: a processing unit determining a sensing matrix for the set function by learning a relationship between the group of sampling data and the group of data, wherein a number of the group of sampling data is less than a number of the group of data.

Embodiment 4: A compressed sensing apparatus as described in Embodiment 3, wherein the processing unit is further used for: generating the Fourier basis set containing a plurality of Fourier bases that is determined on the basis of a relationship of corresponding sets' intersection and more than a threshold value; determining a Fourier transform matrix based on the Fourier basis set; and computing a reconstruction matrix based on the sensing matrix and the Fourier transform matrix.

Embodiment 5: A compressed sensing apparatus as described in Embodiment 4, wherein the processing unit is further used for: reconstructing the plurality of input sets by estimating the group of data based on the reconstruction matrix, the Fourier coefficient set and the Fourier basis set.

Embodiment 6: A compressed sensing apparatus as described in Embodiment 1, wherein the Fourier coefficient set contains a plurality of Fourier coefficients for the set function.

Embodiment 7: A compressed sensing system for compressed sensing and transmitting of a set function consisting of a plurality of input sets containing a group of data, including: at a transmitting end, a plurality of sensing units acquiring a group of sampling data representing a plurality of sampling sets selected out of the plurality of input sets; a compression and computation unit enabling a compression to the group of data based on the group of sampling data in accordance with a Fourier basis set generated on the basis of the plurality of input sets and sampling sets, and a computation to compute a Fourier coefficient set based on a sparse regression technique which is in relation with the Fourier basis set; and a RF transmitter sending the Fourier coefficient set through a wireless communication module; and at a receiving end, a RF receiver receiving the Fourier coefficient set sent from the transmitter; and a reconstruction unit estimating the group of data based on the Fourier coefficient set.

Embodiment 8: The compressed sensing system as described in Embodiment 7, wherein the transmitting end and the receiving end are communicatively connected with each other through the wireless communication module.

Embodiment 9: The compressed sensing system as described in Embodiment 7, wherein the wireless communication module is a Bluetooth communication module, a Wi-Fi communication module, a telecommunication module, an infrared communication module, or a radio frequency transmission module.

Embodiment 10: A compressed sensing method for compressed sensing of a set function consisting of a plurality of input sets containing a group of signals, including: performing a sampling by a plurality of sensor units to acquire a group of sampling signals representing a plurality of sampling sets selected out of the plurality of input sets; enabling a compression to the group of signals with respect to the group of sampling signals by a compression unit in accordance with a Fourier basis set generated on the basis of the plurality of sampling sets and input sets; computing a Fourier coefficient set by a computation unit based on a sparse regression technique in relation with the group of sampling signals; and enabling a reconstruction to reconstruct the group of signals based on the Fourier coefficient set.

Embodiment 11: A compressed sensing method as described in Embodiment 10, further including: determining a sensing matrix for the set function by a processing unit by learning a relationship between the group of sampling signals and the group of signals, wherein a number of the group of sampling signals is less than a number of the group of signals.

Embodiment 12: A compressed sensing method as described in Embodiment 11, further including: generating the Fourier basis set containing a plurality of Fourier bases that is determined on the basis of a relationship of corresponding sets' intersection and more than a threshold value by the processing unit; determining a Fourier transform matrix based on the Fourier basis set by the processing unit; and computing a reconstruction matrix based on the sensing matrix and the Fourier transform matrix by the processing unit.

Embodiment 13: A compressed sensing method as described in Embodiment 12, further including: reconstructing the plurality of input sets by estimating the group of signals based on the reconstruction matrix, the Fourier coefficient set and the Fourier basis set by a reconstruction unit.

Embodiment 14: A compressed sensing method as described in Embodiment 10, further including by a processing unit to perform: generating the Fourier basis set containing a plurality of Fourier bases available from performing a computation to all of the plurality of intersected Fourier bases F'(i, j) consisting of intersected $i^{th}$ order and $j^{th}$ Fourier bases for i=0~N, j=1~$C_j^N$, where F'(i, j) denotes an intersected set function of input sets for respective different Fourier bases, i denotes respective $i^{th}$ order bases from 0 to a number of the plurality of input sets N, and j denotes respective $j^{th}$ bases in a particular $i^{th}$ order basis from 1 to totally $C_j^N$; determining whether each of the plurality of intersected Fourier bases F'(i, j) is more than a threshold value β; saving F'(i, j) as a Fourier basis $f_B$ and pushing it to a temporary repository of Fourier basis $f_{B\_1}$ if F'(i, j) is more than the threshold value β; skipping this basis if F'(i, j) is not more than the threshold value β; and ceasing the computation when the temporary repository of Fourier basis $f_{B\_1}$ is empty.

Embodiment 15: A compressed sensing method as described in Embodiment 14, wherein when the threshold value β is set as zero, the generated Fourier basis set includes all Fourier bases required to exactly recover the set function.

Embodiment 16: A compressed sensing method as described in Embodiment 14, wherein when the threshold value β is larger than zero, a part of all Fourier bases required to exactly recover the set function is discard to approximate the set function.

Embodiment 17: A compressed sensing method as described in Embodiment 10, wherein the Fourier coefficient set contains a plurality of Fourier coefficients for the set function.

While the disclosure has been described in terms of what are presently considered to be the most practical and preferred embodiments, it is to be understood that the disclosure need not be limited to the disclosed embodiments. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present disclosure which is defined by the appended claims.

What is claimed is:

1. A compressed sensing apparatus for compressed sensing of a set function consisting of a plurality of input sets containing a group of data, comprising:
   a plurality of sensing units acquiring a group of sampling data representing a plurality of sampling sets selected out of the plurality of input sets, wherein a number of the group of sampling data is less than a number of the group of data;
   a compression and computation unit configured to determine a sensing matrix for the set function by learning a relationship between the group of sampling data and the group of data, and generate a Fourier basis set containing a plurality of Fourier bases by collecting Fourier bases that are large than a threshold value and intersected among each of the plurality of input sets to enable a compression to the group of data based on the group of sampling data in accordance with the Fourier basis set, and compute a Fourier coefficient set based on a sparse regression technique which is in relation with the Fourier basis set, a Fourier transform matrix based on the Fourier basis set, and a reconstruction matrix based on the sensing matrix and the Fourier transform matrix; and
   a reconstruction unit configured to reconstruct the group of data based on the reconstruction matrix, the Fourier coefficient set, and the Fourier basis set.

2. The compressed sensing apparatus as claimed in claim 1, wherein the plurality of sensing units are sensors selected from an image sensor, a group consisting of a Piezoelectric crystal chemical sensor, a surface acoustic wave sensor, an optical chemical sensor, an electrochemical sensor, a semiconductor-based chemical sensor, a surface plasmon resonance chemical sensor, a biosensor, a thermochemical sensor, a magnetic chemical sensor, a field chemical sensors, a toxic gas field chemical sensor, a chemical sensor, a MEMS based sensor, a Nano-crystal chemical sensor, an electromagnetic wave sensor, a mechanical wave sensor, a heat sensor, a force sensor, and a combination thereof.

3. A compressed sensing apparatus as claimed in claim 1, wherein the Fourier coefficient set contains a plurality of Fourier coefficients for the set function.

4. A compressed sensing system for compressed sensing and transmitting of a set function consisting of a plurality of input sets containing a group of data, comprising:
   at a transmitting end,
   a plurality of sensing units acquiring a group of sampling data representing a plurality of sampling sets selected out of the plurality of input sets;
   a compression and computation unit configured to determine a sensing matrix for the set function by learning a relationship between the group of sampling data and the group of data, and generate a Fourier basis set containing a plurality of Fourier bases by collecting Fourier bases that are large than a threshold value and intersected among each of the plurality of input sets to enable a compression to the group of data based on the group of sampling data in accordance with the Fourier basis set, and compute a Fourier coefficient set based on a sparse regression technique which is in relation with the Fourier basis set, a Fourier transform matrix based on the Fourier basis set, and a reconstruction matrix based on the sensing matrix and the Fourier transform matrix; and
   a RF transmitter sending the Fourier coefficient set through a wireless communication module; and
   at a receiving end,
   a RF receiver receiving the Fourier coefficient set sent from the transmitter; and
   a reconstruction unit configured to reconstruct the group of data based on the reconstruction matrix, the Fourier coefficient set, and the Fourier basis set.

5. The compressed sensing system as claimed in claim 4, wherein the transmitting end and the receiving end are communicatively connected with each other through the wireless communication module.

6. The compressed sensing system as claimed in claim 4, wherein the wireless communication module is a Bluetooth communication module, a Wi-Fi communication module, a telecommunication module, an infrared communication module, or a radio frequency transmission module.

7. A compressed sensing method for compressed sensing of a set function consisting of a plurality of input sets containing a group of signals, comprising:
  performing a sampling by a plurality of sensor units to acquire a group of sampling signals representing a plurality of sampling sets selected out of the plurality of input sets, wherein a number of the group of sampling data is less than a number of the group of data;
  determining a sensing matrix for the set function by learning a relationship between the group of sampling signals and the group of signals, generating a Fourier basis set containing a plurality of Fourier bases by collecting Fourier bases that are large than a threshold value and intersected among each of the plurality of input sets to enable a compression to the group of signals with respect to the group of sampling signals by a compression unit in accordance with the Fourier basis set, and computing a Fourier coefficient set by a computation unit based on a sparse regression technique in relation with the Fourier basis set, a Fourier transform matrix based on the Fourier basis set, and a reconstruction matrix based on the sensing matrix and the Fourier transform matrix by a processing unit; and
  enabling a reconstruction to reconstruct the group of signals based on the reconstruction matrix, the Fourier coefficient set, and the Fourier basis set by a reconstruction unit.

8. A compressed sensing method as claimed in claim 7, wherein the processing unit is further configured to perform:
  generating the Fourier basis set containing a plurality of Fourier bases available from performing a computation to all of the plurality of intersected Fourier bases F'(i, j) consisting of intersected $i^{th}$ order and $j^{th}$ Fourier bases for i=0~N, j=1~$C_j^N$, where F'(i, j) denotes an intersected set function of input sets for respective different Fourier bases, i denotes respective $i^{th}$ order bases from 0 to a number of the plurality of input sets N, and j denotes respective $j^{th}$ bases in a particular $i^{th}$ order basis from 1 to totally $C_j^N$;
  determining whether each of the plurality of intersected Fourier bases F'(i, j) is more than a threshold value β;
  saving F'(i, j) as a Fourier basis $f_B$ and pushing it to a temporary repository of Fourier basis $f_{B\_1}$ if F'(i, j) is more than the threshold value β;
  skipping this basis if F'(i, j) is not more than the threshold value β; and
  ceasing the computation when the temporary repository of Fourier basis $f_{B\_1}$ is empty.

9. A compressed sensing method as claimed in claim 8, wherein when the threshold value β is set as zero, the generated Fourier basis set includes all Fourier bases required to exactly recover the set function.

10. A compressed sensing method as claimed in claim 8, wherein when the threshold value β is larger than zero, a part of all Fourier bases required to exactly recover the set function is discard to approximate the set function.

11. A compressed sensing method as claimed in claim 7, wherein the Fourier coefficient set contains a plurality of Fourier coefficients for the set function.

* * * * *